United States Patent
Soni

(10) Patent No.: US 7,432,823 B2
(45) Date of Patent: Oct. 7, 2008

(54) TAMPER DETECTION APPARATUS FOR ELECTRICAL METERS

(75) Inventor: Devendra K. Soni, Maryland Heights, MO (US)

(73) Assignee: Distribution Control Systems, Inc., Hazelwood, MO (US)

( * ) Notice: Subject to any disclaimer, the term of this patent is extended or adjusted under 35 U.S.C. 154(b) by 386 days.

(21) Appl. No.: 11/270,789

(22) Filed: Nov. 9, 2005

(65) Prior Publication Data

US 2007/0103334 A1    May 10, 2007

(51) Int. Cl.
   *G08B 23/00* (2006.01)

(52) U.S. Cl. .................. 340/870.02; 324/110; 340/566; 340/568.1

(58) Field of Classification Search ............ 340/870.02, 340/870.03, 566, 568.1; 324/110
See application file for complete search history.

(56) References Cited

U.S. PATENT DOCUMENTS

| | | | |
|---|---|---|---|
| 4,707,679 A | 11/1987 | Kennon et al. | |
| 5,086,292 A | 2/1992 | Johnson et al. | |
| 5,473,322 A * | 12/1995 | Carney | 340/870.02 |
| 5,940,009 A | 8/1999 | Loy et al. | |
| 5,999,096 A | 12/1999 | Herbert | |
| 6,118,269 A | 9/2000 | Davis | |
| 6,208,266 B1 * | 3/2001 | Lyons et al. | 340/870.02 |
| 6,232,886 B1 * | 5/2001 | Morand | 340/870.02 |
| 6,236,197 B1 | 5/2001 | Holdsclaw et al. | |
| 6,362,745 B1 | 3/2002 | Davis | |
| 6,801,865 B2 | 10/2004 | Gilgenbach et al. | |
| 6,844,825 B2 | 1/2005 | Shincovich | |
| 6,852,935 B2 | 2/2005 | Higgins et al. | |

* cited by examiner

*Primary Examiner*—Albert K Wong
(74) *Attorney, Agent, or Firm*—Polster, Lieder, Woodruff & Lucchesi, L.C.

(57) ABSTRACT

Tamper detection apparatus for an electric meter (M) installed at a facility supplied power through an electrical distribution system, the meter being connected to the facility using a receptacle (K) and monitoring electricity usage at the facility for electricity delivered to the facility flowing through the meter. A sensor (RR) senses movement of the meter more than a predetermined amount with respect to the receptacle, whether or not electricity is flowing through the meter, and produces a tampering signal when this occurs. A second and optional sensor (Z) senses the proximity of the meter to its receptacle with removal of meter from its receptacle producing a tampering signal representative thereof. Generation of a tampering signal results in a tamper alert signal being transmitted to the system through a two-way communications path established between the facility and the system.

22 Claims, 1 Drawing Sheet

TAMPER DETECTION APPARATUS FOR ELECTRICAL METERS

CROSS REFERENCE TO RELATED APPLICATIONS

None

STATEMENT REGARDING FEDERALLY SPONSORED RESEARCH OR DEVELOPMENT

N/A

BACKGROUND OF THE INVENTION

This invention relates to meters used by utilities to measure usage of electrical power, gas, or water by a consumer at whose premises the meter is installed, and more particularly, to tamper detection apparatus used to determine when a customer intentionally tries to tamper with or bypass the meter, or when someone swaps the meter with another meter.

Utility meters installed at a person's home or business are used by utilities for billing purposes. The meter measures consumption of the service provided and a statement, invoice, or bill to the customer is generated based upon the amount of consumption. A watt-hour meter, for example, is used to measure and record electrical energy consumption. The meter is usually either an electromechanical or electronic type meter and has a 4, 5 or 6 digit counter dial on its face for indicating electrical energy usage by the customer. Electrical service to the home or business is routed through the meter with a dial counter reading advancing in proportion to the amount of energy consumed.

For many years, an electrical meter was periodically (monthly) read by a meter reader who went to the home or business and recorded the current dial reading. This reading was then compared to the previous reading and a bill to the customer was calculated based upon the difference between the two readings. Now, due to advances in meter technology, a meter can be remotely read. With such meters, a signal indicative of energy usage (as well as certain other information related to the meter, power usage, quality of available power, etc.) is transmitted from the meter to the utility company. This information may be transmitted over electrical power lines, telephone lines, as a radio frequency signal, or by other means. The technology which allows this to be accomplished is commonly referred to as "Automated Meter Reading" or AMR, and includes electronic circuitry which captures, generates, stores and transmits the data. In this mode of operation, an AMR capable meter (hereafter referred to as an "AMR") functions as a transponder. The meter, whether a conventional meter or AMR, is electrically connected between the utility company's power supply and the customer's home or business. Typically, the meter, which is provided by the utility, has a housing with one or more male connector plugs which are inserted into female connectors incorporated in a socket base to which the meter is mounted so to electrically connect the utility company's power supply side with the customer's power side.

Increased use of AMRs has reduced site visits by meter readers. It has also provided opportunities for someone to tamper with the meter. A common form of tampering is a customer swapping their AMR with that of someone who uses less electricity. For example, someone with a summer home is usually away from it during the winter, so energy consumption at the dwelling is very low compared to that of a house occupied year around. It is not unknown for a dishonest customer to swap his meter with that installed at the summer home and receive a significantly lower electric bill than they otherwise would receive. The part time resident, of course, receives a much higher electric bill. This type of swapping is possible because most meters used in this country are of the plug and socket type described above. As can be inferred from the foregoing, the two basic steps in meter tampering are 1) physical removal of the meter from its socket (disconnection), and 2) its reinstallation in the same or another socket (reconnection). Typically meters cannot be tampered with without first removing them from their sockets.

Other things people have known to do are to remove the meter and subsequently reinstall it such that the meter no longer reads the "true" electrical usage, but reads a significantly lower usage. During the removal time, some type of by-pass is employed so power still reaches the facility. It is also known by some dishonest persons to reverse rotation of the dials of a meter so to show negative power usage.

Because utilities are aware of the types of practices described above, they have taken steps to detect such activities. For example, meter removal can be detected using commercially available devices such as a ball or tilt switch, magnet and reed switches, moving ball and light interrupters, mercury switches, liquid filled tilt sensors, accelerometers, and piezoelectric sensors which sense vibrations as the meter is moved. Those skilled in the art will understand that while these various sensors are effective in sensing meter movement associated with its removal and reinstallation, something else must also be done. This is because current sensors are sufficiently sensitive that in addition to sensing movement of the meter as it is being removed, they will also sense other occurrences such as a foreign object striking the meter or its supporting structure (e.g., a wind blown rock). When these incidents, which are unrelated to attempts to tamper with the meter are reported, they create, in effect, false alarms. Since these non-tampering events will occur much more frequently than an actual tampering, the resultant false alarms could overwhelm those at the utility responsible for dealing with tampering incidents. Accordingly, any apparatus used with the meter must be able to recognize and distinguish actual tampering from these other occurrences.

BRIEF SUMMARY OF THE INVENTION

The present invention, briefly stated, is directed to a method and apparatus for detecting actual tampering with an electrical energy meter in an AMR network of meters. Resident control circuitry, which is part of transponder circuitry for remote automatic meter reading, is used for tamper detection. The circuitry incorporates a computer program resident on central control equipment of the AMR network to gather and analyze meter data and report tampering and/or meter swapping. Tamper detection includes use of one or more sensors which sense tilting of the meter, together with a sensor (which may, in the future, be a RFID tag or other type of sensor) which acts as a proximity detector detecting movement and removal of a meter from its socket base. When someone removes the meter from its socket, an alert signal is generated, as is a command signal which compels the central control equipment to recognize occurrence of the event. In addition, if someone attempts to tamper with the meter when power from the utility is not available, or supply side power is interrupted, such attempt will also be detected. The control equipment also recognizes, through usage signature analysis and electrical usage patterns (both before and after swapping) a tampering incident, and causes the utility to be notified so appropriate action is taken. When meter swapping occurs, the method of the invention insures that the tampering with both meters is detected and reported.

The method and apparatus of the invention provide a number of advantages. First, both meter tampering and meter swapping is readily detected and reported. Second, the method and apparatus is usable with all types of single and three-phase meters, whether or not AMR capable, including conventional electromechanical and electronic meters. Next, detection occurs regardless of the availability of power at the user's facility when the tampering occurs so tampering during a power outage is also detected. The information provided to the utility includes when a tampering occurred, its duration, if the utility power was available or not at the time of the tampering event, and if meters were swapped, the identities of both the perpetrator and victim. Importantly, any false alarms are discarded.

The detection and reporting system is activated during meter installation and is subsequently used both with power line communication systems such as a two-way automated communications system or TWACS®, as well as other means of communication including, but not limited to RF communications and telephone communications systems. As such, the method and apparatus of the invention are usable with any AMR system regardless of the system's communication method.

Other objects and features will be in part apparent and in part pointed out hereinafter.

BRIEF DESCRIPTION OF THE SEVERAL VIEWS OF THE DRAWINGS

The objects of the invention are achieved as set forth in the illustrative embodiments shown in the drawings which form a part of the specification.

Corresponding reference characters indicate corresponding parts throughout the several views of the drawings.

DETAILED DESCRIPTION OF INVENTION

The following detailed description illustrates the invention by way of example and not by way of limitation. This description will clearly enable one skilled in the art to make and use the invention, and describes several embodiments, adaptations, variations, alternatives and uses of the invention, including what I presently believe is the best mode of carrying out the invention. As various changes could be made in the above constructions without departing from the scope of the invention, it is intended that all matter contained in the above description or shown in the accompanying drawings shall be interpreted as illustrative and not in a limiting sense.

Figure 1:
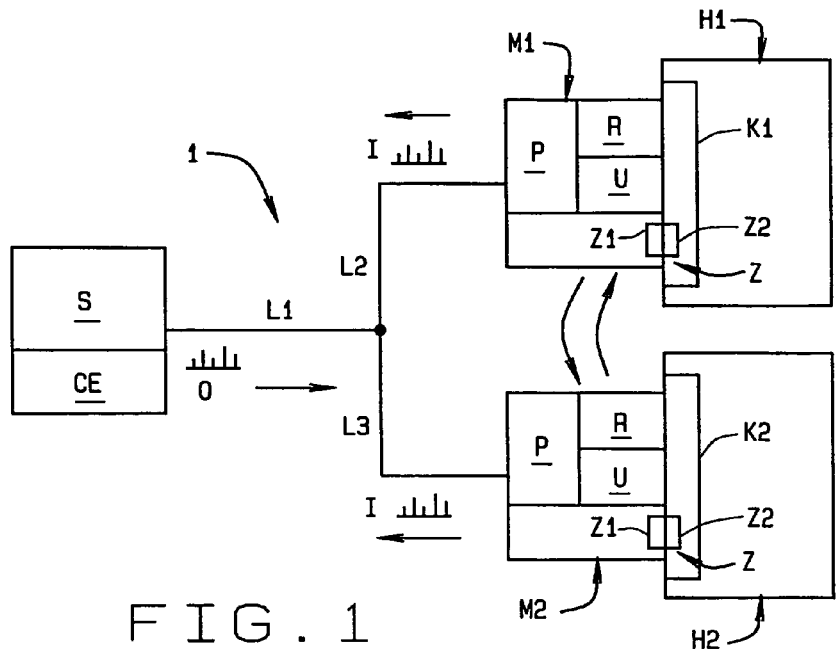
FIG. 1 is a simplified representation of an electrical power distribution network together with tamper detection apparatus of the present invention; and, FIG. 2 is a flow chart illustration what occurs at the time of an attempted tampering.

Referring to the drawings, an electrical power distribution network 1 includes a power station S from which electricity is transmitted over power lines L1-L3 to user facilities such as houses H1 and H2. An electricity meter M1, M2 is connected at the interface between the power lines and the respective facility to monitor and report the usage of energy at that facility. For this purpose, each meter is mounted in a receptacle or socket K1, K2 on a wall of the facility. As is known in the art, various types of meters are in use, with electronic or AMR type meters becoming more commonplace. As previously noted, meter tampering sometimes occurs by which a person attempts to "trick" the system by by-passing or otherwise tampering with the meter so electrical usage is not recorded, or is under reported. As also previously noted, and as indicated by the arrows in FIG. 1, it also sometimes occurs that someone will actually remove the meters from two facilities and swap them. Accordingly, the present invention is directed to apparatus for the remote detection of illegitimate removal and reinstallation of a meter M from its socket K, including swapping the meter with a meter from another installation. As is described hereinafter, a sensor R detects movement of the meter and generates an "alert" signal which is directed from the meter location to station S, for example, where it is read by control equipment (CE) installed at the station. The control equipment then performs an analysis of energy usage patterns both before and after the occurrence of a reported incident to detect if there is a significant change in the "signature" of the pattern. If such a change is noted, the control equipment reports a meter tampering and/or meter swapping occurrence to system management so appropriate corrective action can be taken.

Each meter M1, M2 has an electronic circuit module or transponder P fitted into, or integrated with the meter, before the meter is deployed in the field. The transponder measures or collects information related to energy use at the facility, stores the information, and then transmits the information from the facility to the station using power lines as a communication media, or as a carrier, or using some other communications method. Using TWACS, for example, a query signal, referred to as an outbound signal O is sent from the station to each meter M. In response to the query signal, the transponder at each meter generates a response or inbound signal I containing requested information and sends this inbound signal back to the station over the same power lines. Although not described herein, those skilled in the art understand that telephone lines, radio frequency signal, or other communication techniques can also be used to request and receive information. Each transponder P contains certain basic information including an identification number unique to that meter. When an inbound signal is formulated by the transponder, the message contents include, for example, a path identifier (electrical network substation identification, bus number, feeder number, phase information, etc.) corresponding to the transponder or meter. This enables control electronics CE, when an inbound message is processed, to verify (using a look-up reference in a database for the utility) that the meter from which the message is sent has the unaltered path, or a path variation known to the utility. Occasionally, meter swapping could occur between the meters on the same path. Additional tests, such as the usage signature analysis, described elsewhere herein would be performed. Those skilled in the art will appreciate that other two-way communications means can also be used such as communicating over telephone lines or using RF communications.

In addition to transponder P and other components of a meter M, the meter incorporates sensor R for sensing movement of the meter. As previously noted, sensor R is one of a variety of sensors. Sensor R can be a tilt sensor fitted on a printed circuit board (not shown) of the transponder, and its associated electronic circuit. Examples of tilt sensors which can be used in meter M include a miniature ball switch, a reed switch with its associated magnet, a moving ball with a light interrupter, a mercury switch, a conductive liquid filled resistance sensing tilt sensor, a miniaturized accelerometer, and a piezoelectric sensor. All of these sensors are commercially available and are not described.

The electronic circuits used with the respective tamper detection sensors are powered from one of three sources. First is a normal power source which supplies power to transponder P when nominal power at the utility supply end of the meter is available. A second power source, referred to as a "ride through" power source, is a power source created by charging a capacitor (not shown) installed within meter M. When nominal power at the utility supply side of the meter is not available, the capacitor supplies power to the tamper detection circuit for a predetermined time immediately after the loss of power from the utility. The third power source, referred to as the back-up power source, comprises a commercially available long life lithium battery (also not shown), or a similar rechargeable or non-rechargeable battery. The battery is capable of providing sufficient power to the tamper detection circuit for an extended period of time when power from the first and second power sources are not available. If the ride-through time provided by the second power source is designed to be sufficiently long (6 hours, 12 hours, or 18 hours, for example) the third power source may not be necessary.

Sensor R is installed so that contacts of its switch element are in a normally closed or N/C position. Meter M is normally installed in a vertical orientation so one can, for example, view the meter's readout simply by looking at the face of the meter. In this vertical meter position, the switch contacts of sensor R are closed. If a sensor R, such as a liquid filled tilt switch is used, a variable resistance portion of the sensor is incorporated in a Wheatstone bridge circuit. When the meter is moved, the switch moves from its steady state position (with the normally closed contacts opening) and the liquid in a bulb portion of the tilt switch assumes a new position. This, in turn, changes the resistance between electrodes in the branch of the Wheatstone bridge incorporating the sensor. When the meter moves more than the predetermined distance, a digital signal is produced and supplied to a counter U.

With respect to the foregoing, those skilled in the art will understand that this feature can also be implemented using an inverted logic with the sensor's switch elements now initially being in a normally open or N/O position. Now when the meter is moved, the switch moves from its steady state position (with the normally open contacts closing) as the liquid in the bulb portion of the tilt switch assumes its new position.

Another embodiment of the invention employs a miniature leaf switch in place of the tilt sensor described above. This miniature switch is fitted on one of the contact blades of the meter, or on the periphery of the meter's collar that slips into the meter socket. When the meter is installed correctly, an actuator of the switch is pressed and the switch change its contact status from normally open to normally closed, or vice versa. When the meter is subsequently removed from its socket, the switch's contact status is changes. The change in contact status of the switch associated with the installation and removal of the meter, along with a debouncing electronic circuit of the type well-known in the art, is now used to activate digital counter U as before. The debouncing electronic circuit recognizes the first changed state condition activated by the switch, and latches the circuit into this condition for a predetermined period of time, until the switch's contact bounce settles down. In this way, the circuit will respond to only one pulse generated by actuation of the switch, and not the several state transitions caused by the contact bounce. The advantages of this approach are: first, a positive indication linked with meter insertion into, or removal from, the socket; and second, avoidance of false alarms resulting from severe vibrations of the meter due to any number of reasons. For example, a falling tree striking it or an earthquake, etc., all as previously noted. Third, counter U rollover is minimized because the counter advances its count value only one increment upon removal of the meter, and one increment upon re-installation, every time the meter is removed or installed. Fourth, if a tilt switch is used, it is possible counter U will advance multiple times because of the contact change that occurs due to vibration of the meter during handling after its removal from its socket, which can be avoided. It will be recognized that the switch's installation requires modifying the meter's male contact blade that fits into the female contact jaws of socket S, or a modification of the meter collar. Regardless of whether the meter is AMR enabled or not, use of a leaf switch, as discussed above, is effective. An AMR enabled meter will send a tamper alert signal to master station MS using with the applicable communication means; whereas, for non-AMR enabled meters, a local visual indication of tampering can be made.

Typically, when someone attempts to remove meter M from its socket, the meter will move in one direction (with respect to an X, Y, or Z axis) by more than a predetermined amount, 20° for example. Those skilled in the art will appreciate that removal of a meter from its socket, without tilting it, is extremely hard, if not impossible, to do. When that occurs, contacts of the sensor's switch element change from closed to open (or open to closed). Every time there is a change in the status of the contacts, the event is noted by the counter U incorporated in transponder P, and recorded. Counter U comprises an electronic circuit which is part of a micro-controller based module and which counts the electronic signals from sensor R. The count value is stored, for example, in a non-volatile memory. The counter is reset to zero or to a preset value during installation of the meter at the facility, and the counter continues to add to its count value until reset by an appropriate command from control electronics CE. The current count value is supplied to the control electronics in response to a suitable command from the electronics. Counter U counts every input from sensor R in response to meter M being moved more than the predetermined amount.

To optimize performance of counter U, once an event has occurred, all subsequent events occurring during a predetermined time interval (two minutes, for example) after the event are ignored and the count value is not changed in response to another input from the sensor during this time. This is in response to events such as when meter M is being moved from one location to another, or when the meter is being continuously struck by objects such as hailstones during a severe storm; or being constantly shaken as during an earthquake. For purposes of the method of this invention, these events are, in effect, misleading occurrences comprising potential false alarms.

Another transponder logic circuit prevents counter U from responding to a signal from a sensor if power is currently flowing from the utility to the meter to the load. This is because one cannot tamper with or swap a meter without, as previously noted, completely removing it from its socket K; and it will be appreciated that the size, shape, and construction of a meter M make it ordinarily difficult to tamper with the meter. Although a meter M can be removed from its socket whether or not power (voltage) is available from the utility at the time of its removal, most people are aware of the dangers of electrocution (and electrical arcing) if they try to remove the meter with current (power) flowing through it. They may turn off the loads to a most minimum condition, prior to removal of a meter, and at least one end of the meter must be first removed from the socket before the second end is removed. Accordingly, if sensor R senses the movement of the meter while the voltage is present at both ends of the meter, the cause of the movement will not ordinarily be associated with removal of the meter, and the sensor input is ignored. In accordance with the present invention, however, counter U will advance when the meter is completely removed and the status of the sensor switch contacts has changed.

When the count value of counter U changes, an ALERT FLAG digital signal is generated and supplied to control electronics CE. This input to the control electronics causes the electronics to read the new count value in counter U. During manufacture, assembly, and testing of meter M and transponder P, counter U is reset to zero (or to a pre-established count value), and the counter is then disabled so that the counter cannot again be incremented until again enabled. At this time, the ALERT FLAG feature is turned OFF so a signal is not inadvertently sent to the control electronics. A flag status indication, if ON, is reset to OFF, and then disabled. Back-up power to the circuitry is also turned OFF. Once meter M is deployed in the field and is included in the utility's AMR reporting system, the counter circuits and the back-up power are remotely enabled and turned ON. Initial checks with respect to tamper detection are then performed.

As part of meter deployment, and as part of routine testing of AMR functionality, meter M is first searched for within the AMR network for the electrical distribution system, and relevant data for the meter is captured and stored for administrative purpose. This data includes, for example, the meters unique identification number, electrical network substation identification, bus number, feeder number, phase information, etc. Customer information and facility location details are separately entered and stored. Once the installed meter M is identified within the AMR network, and the other required data has been entered, the meter is now available for remote reading of electrical usage at the facility where it is installed. Thereafter, when meter M is interrogated for the first time, certain actions are taken for tamper detection purposes. These include:

Turning on back-up power for the meter;

Checking the contact status of the tilt switch (or an alternative miniature leaf switch or the miniature switch, as applicable). (This will be N/C or N/O depending on the type of the switch logic used, and indicates that meter M is properly installed.).

the status of the ALERT FLAG and turning it OFF, if it is ON. (This makes meter M ready to detect any attempt at tampering.)

Enabling counter U.

Confirming that the count of counter U agrees with the count established during meter setup. (This confirms that the tamper detection circuit is functioning properly.) Now, if an attempt at tampering with, or swapping, meter M now occurs, as previously discussed, this attempt will be recognized by the AMR network, and the incident promptly reported. If, for example, meter M is removed from its socket, Finally, an RFID sensor or tag Z is optionally used for the proximity detection. Tag Z consists of two components Z1 and Z2, one of which is housed within meter M and the other of which is housed in, or attached to, meter socket K. The portion attached to the meter socket does not need a power source for interactive communication. Normally, the two components communicate with each other through an ultra low power radio frequency (RF) link. However, if meter M is removed from its socket, the link is broken. This is recognized as a tampering incident. Generally, when the meter is removed from its socket base, component Z2 attached to the meter socket (a foiled coil element or a small microcircuit chip, or combination of both) will be permanently damaged and must subsequently be replaced.

Figure 2:
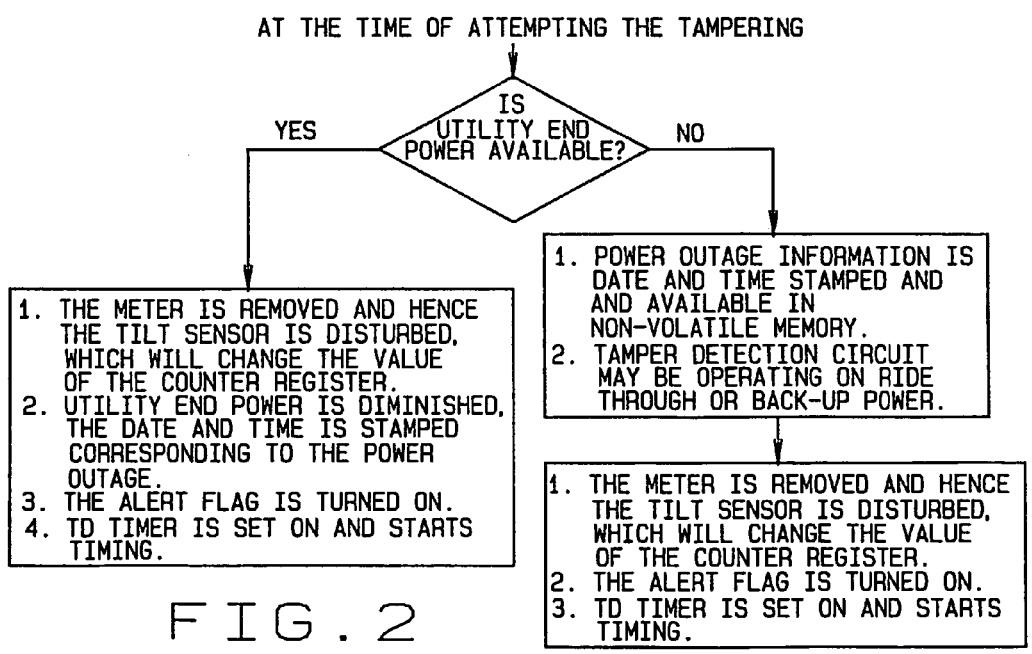

Finally, FIG. 2 is a flow chart illustrating operation of the apparatus for tamper detection. As shown therein, operation of the apparatus is affected by whether or not electrical power is flowing through meter M to the facility at the time tampering occurs.

In view of the above, it will be seen that the several objects and advantages of the present invention have been achieved and other advantageous results have been obtained.

The invention claimed is:

1. Tamper detection apparatus for an electric meter installed at a facility supplied power through an electrical distribution system comprising:

an electric meter monitoring electricity usage at the facility and including connection means for connecting the meter into a receptacle installed at the facility, electricity delivered to the facility flowing through the meter;

sensing means for sensing movement of the meter more than a predetermined amount with respect to the receptacle when no electricity is flowing through the meter and for producing a first tampering signal representative thereof; and, a second sensing means sensing the proximity of the meter to its receptacle with removal of meter from its receptacle producing a second tampering signal representative thereof, the second sensing means comprising an RFID sensor having a first component housed within the meter and a second component attached to the receptacle, the first and second components having a communications link between them which is broken if the meter is removed from its receptacle; and two-way communication means for transmitting an alert signal from the facility to the system to warn of tampering with the meter.

2. The apparatus of claim 1 further including a counter to which the first and second tampering signals are supplied, the counter counting first and second tampering signals supplied to it.

3. The apparatus of claim 2 further including means for recording when a tampering event has occurred and for enabling the communications means to transmit an alert signal to the system.

4. The apparatus of claim 3 in which the counter is set to a predetermined count value during installation of the meter at the facility.

5. The apparatus of claim 4 in which the counter is reset by a reset signal transmitted to the meter through the communications means.

6. The apparatus of claim 2 in which the counter does count successive first and second tamper signals supplied for a predetermined interval after a first alert signal is received and counted, so to prevent misleading and false indications of tampering.

7. The apparatus of claim 1 in which each meter has a unique identifier identifying the meter and the location of the facility at which it is installed whereby if two meters are swapped with each other, information regarding the respective meters and their new locations is supplied to the system through the communications means for each meter.

8. The apparatus of claim 1 in which the two-way communications means transmits and receives information through the same lines as those through electricity is supplied to the facility through the meter.

9. The apparatus of claim 1 in which the two-way communications means includes an RF communications path for transmitting and receiving information.

10. The apparatus of claim 1 in which the two-way communications means includes telephonic communications for transmitting and receiving information.

11. The apparatus of claim 1 in which the sensing means includes a tilt sensor which generates the first tampering signal when the meter moves more than the predetermined amount with respect to the receptacle.

12. The apparatus of claim 11 in which the tilt sensor comprises a ball switch.

13. The apparatus of claim 12 in which the tilt sensor comprises a reed switch with its associated magnet.

14. The apparatus of claim 12 in which the tilt sensor comprises a mercury switch.

15. The apparatus of claim 12 in which the tilt sensor comprises a conductive liquid filled resistance sensing tilt sensor.

16. The apparatus of claim 12 in which the tilt sensor comprises an accelerometer.

17. The apparatus of claim 12 in which the tilt sensor comprises a piezoelectric sensor.

18. The apparatus of claim 12 in which the sensor comprises a variable resistance branch of a Wheatstone bridge circuit so, when the meter is moved, the sensor moves from a steady state position to a new position changing the resistance between in the branch of the Wheatstone bridge incorporating the sensor, with an alert signal being produced when the meter is moved more than the predetermined distance.

19. The apparatus of claim 1 further including a first power source for the meter comprising power supplied to the facility through the meter.

20. The apparatus of claim 19 further including a second power source comprising a capacitor installed within the meter and charged when electricity is flowing through the meter to the facility; but when the electricity is not flowing, the capacitor supplies power to the sensing means for a predetermined time immediately after the loss of electricity.

21. The apparatus of claim 20 further including a third power source comprising a long life battery capable of providing sufficient power to the sensing means for an extended period of time when power from the first and second said power sources is not available.

22. Tamper detection apparatus for an electric meter installed at a facility that receives power from an electrical distribution system, comprising:
  an electric meter operatively connected to a receptacle installed at the facility to monitor electricity usage at the facility, whereby power from the electrical distribution system transmits through the meter to the facility;
  a first sensor operatively connected to the electric meter to sense movement of the meter more than a predetermined amount with respect to the receptacle when no electricity is flowing through the meter and transmit a first tampering signal to the system;
  a second sensor operatively connected to the electric meter to sense the proximity of the electric meter to its receptacle and transmit a second tampering signal to the system if the electric meter is removed from the receptacle, the second sensor comprising a first component housed within the electric meter and a second component attached to the receptacle so that the first component and second component operatively connect if the electric meter is connected to the receptacle and operatively disconnect if the electric meter is disconnected from the receptacle; and
  two-way communicator operatively connected between the facility and the system to transmit an alert signal from the facility to the system to indicate tampering with the meter.

* * * * *